United States Patent [19]

Sadamasa et al.

[11] Patent Number: 4,465,543

[45] Date of Patent: Aug. 14, 1984

[54] APPARATUS AND METHOD FOR ARRANGING SEMICONDUCTOR PELLETS

[75] Inventors: Tetsuo Sadamasa, Kawasaki; Osamu Ichikawa; Tatsuro Beppu, both of Tokyo, all of Japan

[73] Assignee: Tokyo Shibaura Denki Kabushiki Kaisha, Kawasaki, Japan

[21] Appl. No.: 421,099

[22] Filed: Sep. 22, 1982

[30] Foreign Application Priority Data

Sep. 22, 1981 [JP] Japan ............................. 56-148844

[51] Int. Cl.$^3$ .................... B44C 1/14; B65C 9/00; B21D 39/03; B23Q 3/18
[52] U.S. Cl. ................. 156/542; 156/238; 156/241; 156/233; 156/552; 29/430; 29/559; 269/903
[58] Field of Search ............ 209/538, 541, 545, 695; 29/430, 429, 433, 559, 568, 587; 150/230, 233, 235, 238, 239, 241, 379.8, 362, 559, 560, 552, 557, 561, 584, 562, 361, 498, 478, 542, 566, 541, 579, 300

[56] References Cited

U.S. PATENT DOCUMENTS

| | | | |
|---|---|---|---|
| 3,708,372 | 1/1973 | Coatreras | 156/552 |
| 3,715,258 | 2/1973 | Cunnane | 156/362 |
| 3,743,558 | 7/1973 | Ludwig | 156/552 |
| 3,785,903 | 1/1974 | Boyer et al. | 150/552 |
| 3,894,633 | 7/1975 | Egan et al. | 156/584 |
| 4,021,292 | 5/1977 | Bates et al. | 156/552 |
| 4,029,536 | 6/1977 | Kovacs et al. | 156/552 |
| 4,061,521 | 12/1977 | Lerner et al. | 156/561 |
| 4,142,662 | 3/1979 | Holbrook et al. | 156/233 |
| 4,239,576 | 12/1980 | Taki et al. | 156/300 |
| 4,291,867 | 9/1981 | Williams et al. | 269/903 |

FOREIGN PATENT DOCUMENTS 92292 10/1983 European Pat. Off. .
2035942 6/1980 United Kingdom ................. 29/430

OTHER PUBLICATIONS

Avins, RCA Technical Notes No. 802, Nov. 27, 1968, RCA Publ., Princeton, NJ (5 sheets).

*Primary Examiner*—Edward C. Kimlin
*Assistant Examiner*—Louis Falasco
*Attorney, Agent, or Firm*—Oblon, Fisher, Spivak, McClelland & Maier

[57] ABSTRACT

An apparatus transposes a matrix of semiconductor pellets mounted on a first adhesive tape to a second adhesive tape in such a manner that the respective pellet rows are arranged spaced from the adjacent pellet rows. It has pellet-supporting means having an inclined plane and apical plane. The first adhesive tape bearing the matrix is carried stepwise along the inclined plane toward the apical plane to successively bring the respective rows of the matrix to the apical plane. Above the apical plane, a second adhesive tape is carried in a direction intersecting the pellet columns at right angles with the adhesive plane thereof facing the matrix. When each row mounted on the first tape is on the apical plane, the second tape is pressed against the row. Each time one pellet row is transposed to the second tape, the pellet-supporting means is shifted in a direction intersecting the pellet columns at right angles.

17 Claims, 6 Drawing Figures

APPARATUS AND METHOD FOR ARRANGING SEMICONDUCTOR PELLETS

BACKGROUND OF THE INVENTION

I. Field of the Invention:

This invention relates to an apparatus and method for arranging semiconductor pellets and more particularly to an apparatus and method for arranging groups of previously divided pellets in the matrix form at a prescribed distance.

II. Description of the Prior Art:

When a plurality of semiconductor pellets are mounted, for example, on a stem or wiring substrate in the manufacture of a semiconductor device, it is demanded to develop a reasonable method and apparatus for previously placing a plurality of the pellets on the specified spots of the stem or wiring substrate and fixing the pellets thereon all at once.

The known method of arranging semiconductor pellets in the above-mentioned manner uses a tape which is thermally expandable and on one side of which an adhesive layer is deposited. A semiconductor wafer is placed on the adhesive layer. The semiconductor wafer on the tape is cut up into a plurality of pellets by a dicing machine. The adhesive tape is thermally expanded to thereby separate the pellets from each other at a prescribed distance.

However, the conventional method of arranging semiconductor pellets is accompanied with the drawbacks that the adhesive tape is not uniformly extended in all directions, presenting difficulties in effecting the precise arrangement of semiconductor pellets. Consequently when the semiconductor pellets separated on the adhesive tape are fixed to the surface of a stem or wiring substrate just as separated, then the displacement of the pellets from the prescribed position often arises.

SUMMARY OF THE INVENTION

It is accordingly the object of this invention to provide a semiconductor pellet-arranging apparatus and method which can separate a plurality of divided semiconductor pellets precisely at a prescribed distance.

The method of this invention is characterized by the step of transposing a matrix of closely contacting semiconductor pellets mounted from a first adhesive tape to a second adhesive tape in such a manner that the rows of pellets are separated from each other at a prescribed distance. The subject apparatus comprises a first pellet-supporting unit including an inclined plane and an apical plane contiguous thereto. The first adhesive tape on which the matrix of pellets is placed progressively travels by a first driving device along the inclined plane toward the apical plane so as to cause the rows of matrix of pellets to be set on the apical plane one after another. Provided above the apical plane of the first pellet-supporting unit is a second driving device which carries the second adhesive tape in a direction intersecting the columns of pellets at right angles with the adhesive plane of the second adhesive tape caused to face the first adhesive tape. When each row of the pellet matrix fixed to the first adhesive tape is mounted on the apical plane of the first pellet-supporting unit, then the second adhesive tape is successively pressed against the pellet row now set on the apical plane by pressing means, thereby causing said pellet row to be transposed to the second adhesive tape. After one pellet row is transposed to the second adhesive tape, the first pellet-supporting unit is shifted by a third drive device for a prescribed distance in a direction intersecting the pellet column at right angles. Thus, the pellet matrix mounted on the first adhesive tape is transposed to the second adhsive tape in such a manner that the respective pellet rows are separated from each other at the aforesaid prescribed distance. As a result, a second pellet matrix is formed on the second adhesive tape.

A semiconductor pellet-arranging device according to a preferred embodiment of this invention further comprises a second pellet-supporting unit like the first one which is positioned below the second adhesive tape and spaced from the first one in the traveling direction of the first tape. A third adhesive tape whose adhesive plane is made to face the second adhesive tape is progressively carried by a fourth drive device for a prescribed distance along the inclined plane of the second pellet-supporting unit toward the apical plane thereof. When the second adhesive tape on which the second pellet matrix is mounted is carried by the second drive device toward the second pellet-supporting unit, and each pellet column of said second pellet matrix, corresponding to each column of the first pellet matrix on the first tape, is successively set on the apical plane of the second pellet-supporting means, then the second adhesive tape is pressed against the pellet column now on the apical plane of the second pellet-supporting unit, thereby causing the respective columns of the second pellet matrix to be successively transposed to the third adhesive tape. After one pellet column is transposed to the third adhesive tape, then the third tape is shifted by the fourth drive device for a prescribed distance. Thus, the respective semiconductor pellets are mounted on the third adhesive tape in a state separated from each other at a prescribed distance.

Therefore, according to this invention a plurality of divided semiconductor pellets can be precisely separated at a prescribed distance, thereby offering a great advantage in effecting the simultaneous deposition of a plurality of semiconductor pellets on a stem or wiring substrate.

DETAILED DESCRIPTION OF THE PREFERRED EMBODIMENTS

Description is now given with reference to the accompanying drawings of a method and apparatus embodying this invention for arranging semiconductor pellets. Throughout the drawings, the same parts are denoted by the same numerals.

Figure 1:
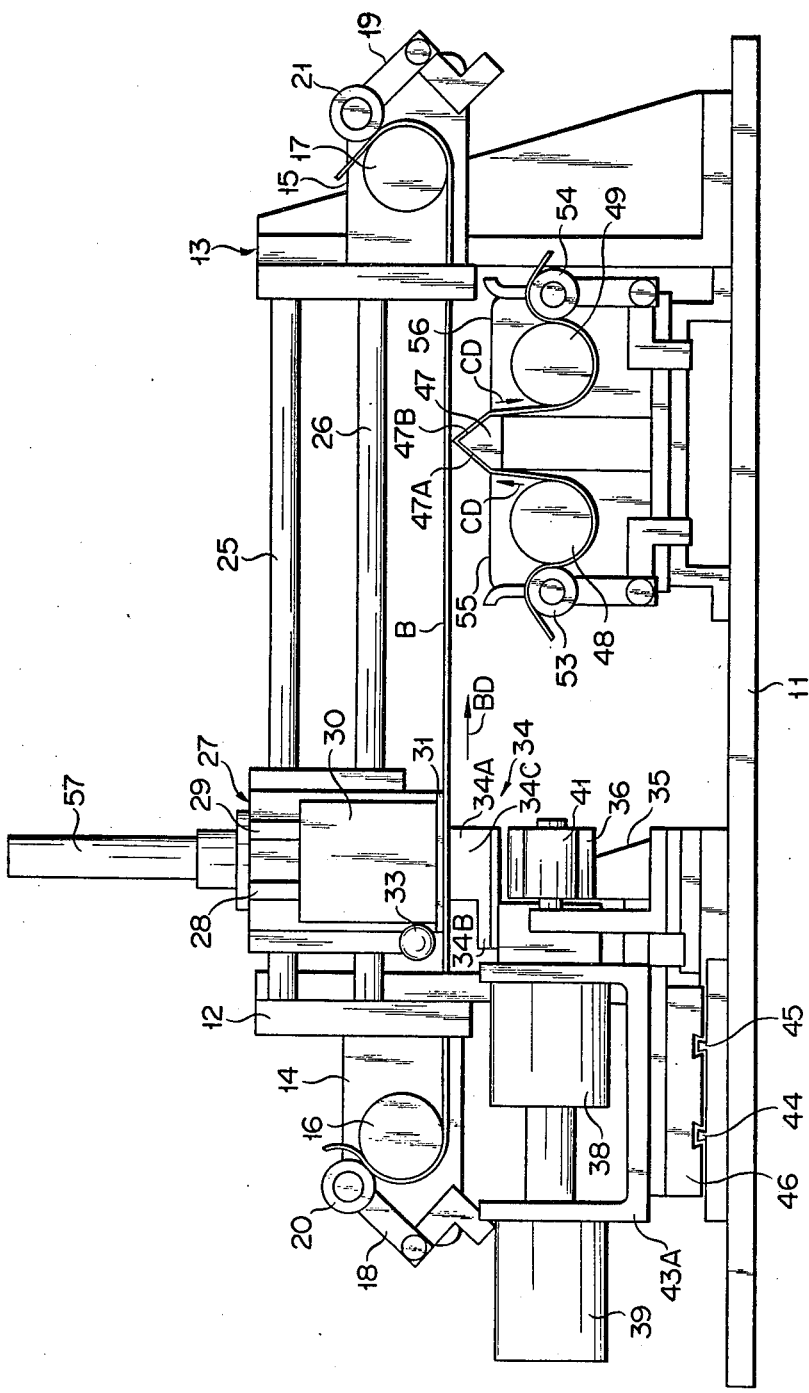
FIG. 1 is a front view of a semiconductor pellet-arranging apparatus embodying this invention.
Figure 2:
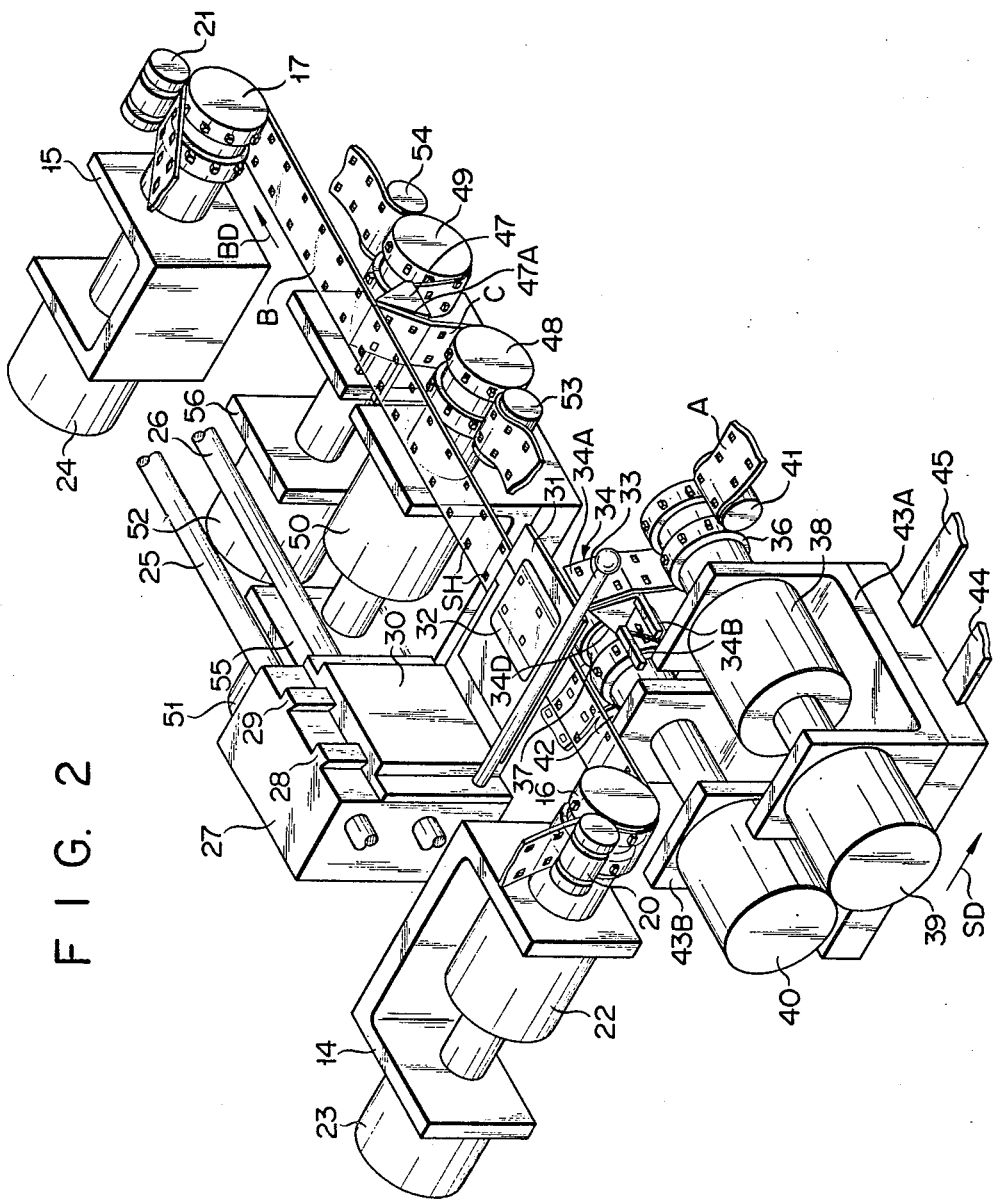
FIG. 2 is a schematic oblique view of the apparatus of FIG. 1.

FIG. 1 is a front view of a semiconductor pellet-arranging apparatus embodying this invention. FIG. 2 is a schematic fractional oblique view of this apparatus. As seen from FIGS. 1 and 2, the semiconductor pellet-arranging apparatus comprises a pair of sprocket wheels 16, 17 spaced from each other at a prescribed distance. Each sprocket wheel comprises a smaller diameter cylindrical body and a pair of larger diameter disks arranged on both sides of the smaller diameter cylindrical body. A plurality of sprockets are spatially formed on the outer periphery of each larger diameter disk. The sprocket wheels 16, 17 are respectively supported by support members 14, 15 fitted to frames 12, 13 in a state spatially positioned from a support stage 11 in parallel therewith.

Stretched between the sprocket wheels 16, 17 is an adhesive tape B which is prepared from, for example, a polyimide film and coated with an adhesive agent, for example, silicone-based adhesive. The adhesive plane of the tape B is kept underside. Both edge portions of the adhesive tape B are respectively provided with linearly arranged sprocket holes SH corresponding to the projections (sprockets) of the sprocket wheels 16, 17.

The adhesive tape B is pressed against the sprocket wheels 16, 17 by means of auxiliary rolls 20, 21 supported by proper levers 18, 19 fitted to the support members 14, 15. The auxiliary rolls 20, 21 are each comprised of a smaller diameter cylindrical body and a pair of larger diameter disks fitted to both ends of said cylindrical body. Formed in the outer peripheral wall of each larger diameter disk is an annular groove having a slightly larger width than each projection of the sprocket wheels 16, 17 and a depth slightly shallower than the height of said each projection. Both edges of the adhesive tape B on which a plurality of sprocket holes SH are linearly arranged are held between the larger diameter disks of the sprocket wheels 16, 17 and larger diameter disks of the auxiliary rolls 20, 21.

The sprocket wheel 16 is connected to a stepping motor 23 through a harmonic drive system 22. The sprocket wheel 17 is connected to a torque motor 24. The harmonic drive system 22 smoothly transmits the drive force of the stepping motor 23 to the sprocket wheel 16. The interlocking operation of the stepping motor 23 and torque motor 24 causes the adhesive tape B to progressively travel in a direction indicated by an arrow BD for a prescribed distance in a stretched state.

Two parallel guide rods 25, 26 extend between the frames 12, 13 in parallel with the adhesive tape B. A support block 27 penetrated by the two parallel guide rods 25, 26 slides horizontally. A slide board 30 is slidably fitted to the support block 27 by means of guide rails 28, 29. A press board 31 is integrally formed with the slide board 30 so as to horizontally project from the lower end of the slide board 30 over the adhesive tape B. A transparent board 32 is fitted into the central part of the press board 31. The press board 31 vertically moves over the slide board along the rails 28, 29 by the manual operation of a rod 33 fitted to said slide board 30.

A semiconductor pellet-supporting unit 34 is positioned below that portion of the adhesive tape B which is stretched between the frames 12, 13 at a prescribed distance from the adhesive tape B (said distance is chosen to be longer than the height of the later described semiconductor pellet). This semiconductor pellet-supporting unit 34 consists of a block 34A having a substantially triangular cross section (hereinafter referred to as "a triangular block"). The apical plane of the triangular block 34A is rendered parallel with the traveling direction BD of the adhesive tape B. The triangular block 34A is supported on a support member 35 by means of rod members 34B, 34B integrally formed with the triangular block 34A.

A pair of sprocket wheels 36, 37 having the same construction as the sprocket wheels 16, 17 are symmetrically positioned with respect to the pellet-supporting unit 34. An adhesive tape A, both lateral edge portions of which are provided with linearly arranged sprocket holes like the adhesive tape B is stretched over the pellet-supporting unit 34 along the inclined planes 34C and 35D thereof between the sprocket wheels 36, 37 with the adhesive plane of the tape A kept upward. A semiconductor pellet matrix (not shown in FIGS. 1 and 2) is mounted on the adhesive plane of the tape A. The sprocket wheel 36 is connected to a stepping motor 39 through a harmonic drive system 38. The other sprocket wheel 37 is connected to a torque motor 40. The interlocking operation of the stepping motor 39 and torque motor 40 causes the adhesive tape A to ride over the inclined plane 34C of the triangular pellet-supporting unit 34 and to come down the inclined plane 34D in a stretched state between the sprocket wheels 36, 37, at a prescribed speed. The adhesive tape A is pressed against the sprocket wheels 36, 37 by the auxiliary rolls 41, 42 having the same construction as the auxiliary rolls 21, 22.

The harmonic drive system 38 and stepping motor 39 are supported by a frame 43A, and the torque motor 40 is supported by a frame 43B. The support frames 43A, 43B and support member 35 which are mounted on a stage 46 are made to reciprocate for a prescribed distance by a proper drive unit (not shown) along guide rails 44, 45 laid on the support stage 11 in a direction intersecting the traveling direction BD of the adhesive tape B at right angles. A second triangular pellet-supporting unit 47 having the similar construction to the pellet-supporting unit 34 is provided at a spot spaced from the pellet-supporting unit 34 as viewed from the traveling direction BD of the adhesive tape B. The apical plane of the second triangular pellet-supporting unit 47 extends in a direction intersecting the traveling direction BD of the adhesive tape B at right angles. Sprocket wheels 48, 49 having the same construction as the sprocket wheels 36, 37 are provided on both sides of the second triangular pellet-supporting unit 47. The sprocket wheel 48 is connected to a stepping motor 51 through a harmonic drive system 50. An adhesive tape C provided with sprocket holes having the same shape as those drilled in the adhesive tape B is stretched over the second triangular pellet-supporting unit 47 between the sprocket wheels 48, 49 with the adhesive plane of the tape C kept upward. The interlocking operation of the stepping motor 51 and torque motor 52 causes the adhesive tape C to ride over the inclined plane 47A of the second triangular pellet-supporting unit 47 in a stretched state between the sprocket wheels 48, 49 and come down the inclined plane 47B of the second triangular pellet-supporting unit 47 at a prescribed speed. The adhesive tape C is pressed against the sprocket wheels 48, 49 by means of auxiliary rolls 53, 54 having the same construction as the auxiliary rolls 41, 42. The stepping motor 51 and harmonic drive system 50 are supported by a frame 55. The torque motor 52 is supported by a frame 56.

Before the subject pellet-arranging apparatus is put into operation, a plurality of pellet matrices each comprising a plurality of rows of pellets and a plurality of columns of pellets are spatially mounted on the adhesive plane of the tape A. In each matrix, the pellets of the columns and rows contact each other. To place the pellet matrices on the tape A, an adhesive layer having a particular shape, (for example, a rectangular shape) is mounted on a plurality of spots spaced from each other at a prescribed distance. A semiconductor wafer, for example, GaP wafer, in which prescribed semiconductor regions are formed is attached to each adhesive layer. The wafer is divided into a plurality of square pellets, each side of which measures, for example, 0.3 mm, by means of a dicing machine. The peripheral section of the wafer which is not attached to the adhesive layer is removed. Alternatively, it is possible to place a semiconductor wafer divided into a plurality of matrix-arranged pellets on a separate adhesive tape, and mount the tape A on the wafer with its adhesive plane made to contact the surface of the wafer, and apply pressure on the superposed mass by a rectangular press board, thereby transposing a square pellet matrix to the adhesive plane of the tape A.

Figure 3:
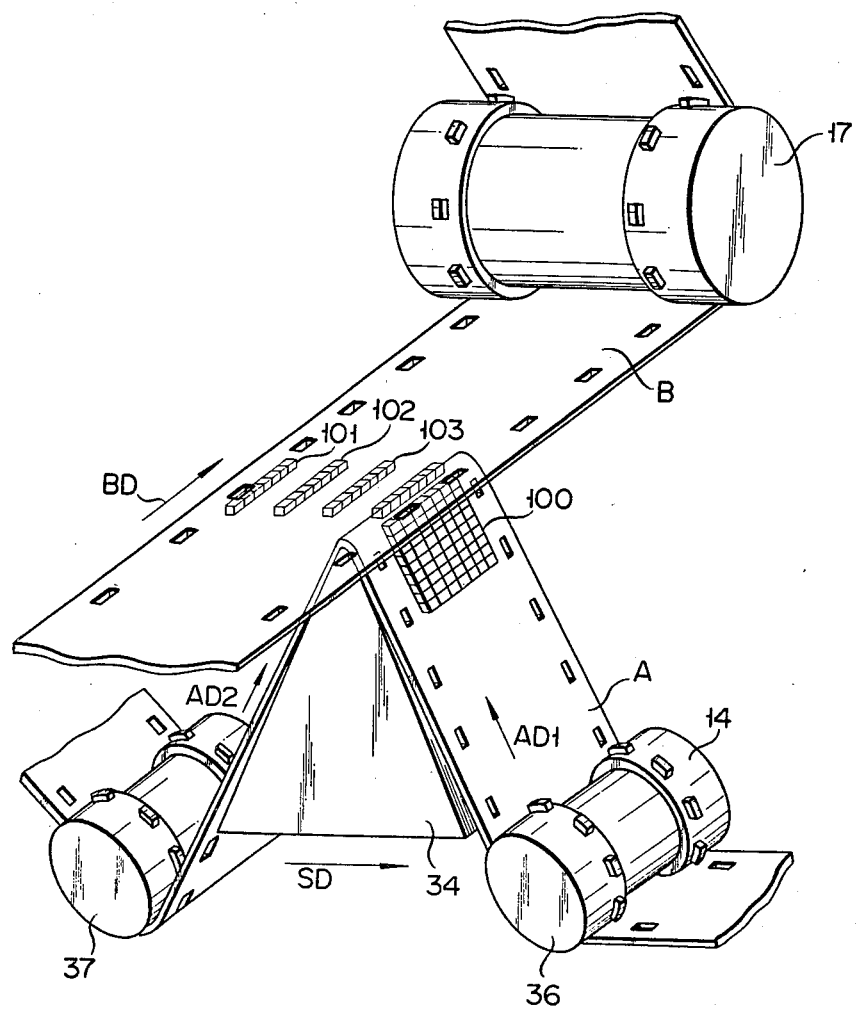
FIG. 3 is an enlarged view of part of the apparatus of FIG. 1.

The tape A on which a plurality of pellet matrices are mounted is stretched over the triangular pellet-supporting unit 34 between the sprocket wheels 36, 37, with the adhesive plane, that is, the pellet matricesbearing plane of the tape A kept upward (see FIG. 3). A tape B is stretched between the spatially arranged sprocket wheels 16, 17 with the adhesive plane of the tape B kept downward. In this case, the tape B is preferred to consist of a transparent material. The tape C is stretched over the triangular pellet-supporting unit 47 between the sprocket wheels 48, 49 with the adhesive plane of the tape C kept upward.

When the adhesive tapes A, B, C are set in place as described above, the support stage 46 travels along the guide rails 44, 45 to be brought below the left side of the tape B as viewed from its traveling direction BD. Later, when the stepping motor 39 and torque motor 40 are driven, the tape A is carried over the triangular pellet-supporting unit 34 in a stretched state in a direction indicated by the arrow AD1. When the first row 101 of the pellet matrix 100 mounted on the tape A is brought to the apical plane of the triangular pellet-supporting unit 34 as seen from FIG. 3, the tape A is brought to rest. When the press board 31 is brought down, the tape B is pressed against that pellet row which is now positioned on the apical plane of the triangular pellet-supporting unit 34. When the press board 31 is lifted, the tape B which is stretched between the sprocket wheels 16, 17 regains its original position. At this time, the pellet row which has been positioned on the apical plane of the triangular pellet-supporting unit 34 is transposed to the adhesive plane of the tape B. A pellet row adjacent to that which lies on the apical plane of the triangular pellet-supporting unit 34 is separated therefrom and is prevented from being transposed to the tape B.

When one pellet row is transposed to the tape B, the support stage 46 is shifted in the direction of an arrow SD to cause the triangular pellet-supporting unit 34 to stop at a spot separated from its first position for a prescribed distance. Again the stepping motor 39 and torque motor 40 are driven to shift the tape A, causing the second pellet row 102 on the tape A to be set on the apical plane of the triangular pellet-supporting unit 34. At this time, the tape B is pressed against the second pellet row 102 to transpose the second pellet row to the tape B.

Repetition of the above-mentioned operation causes the pellet rows 101, 102, 103, . . . on the tape A to be arranged across the tape B at a prescribed distance.

When the transposition of the pellet rows in one pellet matrix on the tape A to the tape B is brought to an end, then the tape B is moved by the stepping motor 23 and torque motor 24 for a prescribed distance in traveling direction BD and is brought to rest there. The above-mentioned operation is carried out in succession to cause the respective pellet rows of the tape A to be spatially arranged across the tape B.

The tape B on the adhesive plane of which a plurality of pellet rows are spatially arranged in the crosswise direction is progressively forwarded. When the first pellet column is brought above the apical plane of the second triangular pellet-supporting unit 47, the support block 27 is made to slide along the guide rods 25, 26. The press board 31 is brought downward while being kept above the triangular pellet-supporting unit 47. As a result, the first pellet column transposed to the tape B is pressed against the tape C on the apical plane of the triangular pellet-supporting unit 47. When the press board 31 is lifted, the tape B regains its original stretched condition. At this time, the pellet column set on the tape B is transposed to the tape C on the apical plane of the triangular pellet-supporting unit 47. Thereafter, the tape C is shifted in the direction of an arrow CD for a prescribed distance by the interlocking operation of the stepping motor 51 and torque motor 52. The tape B is also made to travel, until the second pellet column is positioned above the apical plane of the triangular pellet-supporting unit 47. At this time the press board 31 is brought down to cause the second pellet column to be pressed against the tape C on the apical plane of the triangular pellet-supporting unit 47. The second pellet column is transcribed to the tape C by lifting the press board.

Figure 4:
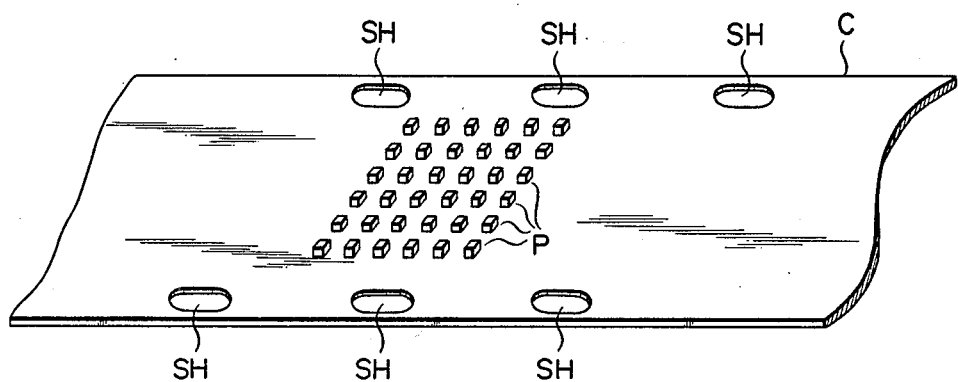
FIG. 4 shows semiconductor pellets separated from each other on a tape.

The repetition of the above-mentioned operation causes the pellet column set on the tape B in a state closely contacted by each other to be transposed to the tape C at a prescribed distance. Thus the pellets initially mounted on the tape A in a state closely contacted by each other are transposed to the tape C in a state separated from each other at a prescribed distance as shown in FIG. 4 wherein reference P denotes the pellet.

A microscope 57 (FIG. 1) may be mounted on the support block 27 so as to be positioned above the transparent plate 32 fitted to the center of the press board 31. It is possible to press the tape B against the tape A and/or tape C while confirming by the microscope 57 that the pellet row set on the tape A is positioned on the apical plane of the triangular pellet-supporting unit 34 and/or the pellet column mounted on the tape B lies on the apical plane of the triangular pellet-supporting unit 47.

As seen from the foregoing description, it is preferred that a pellet row be positioned on the apical plane of the first triangular pellet-supporting unit 34 under a substantially stable condition, and also the unit 34 be possessed of such an apical plane as allows for the easy transposition of said pellet row to the tape B.

Figure 5:
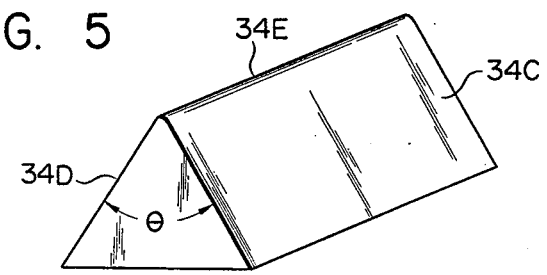
FIG. 5 is an oblique view of a pellet-supporting unit used with the apparatus of the invention.

Description is now given with reference to FIG. 5 of the aforementioned triangular pellet-supporting units 34. The cross section of the apical plane of the triangular pellet-supporting unit 34 of FIG. 5 has a convex curved outline 34E having a relatively large curvature radius. When an angle $\theta$ defined by the inclined plane 34C with the inclined plane 34D indicates 10° to 120°, then only a pellet row mounted on the apical plane 34E is brought into contact with the tape B. At this time, any of the succeeding pellet rows is prevented from contacting the tape B.

Figure 6:
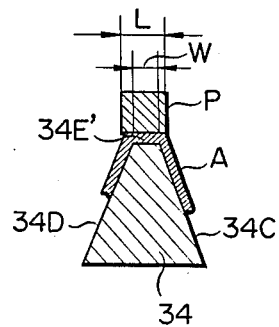
FIG. 6 is a sectional view of another pellet-supporting unit used with the apparatus of the invention.

Description is now given with reference to FIG. 6 of a modification of the aforesaid triangular pellet-supporting unit 34. The apical plane of the triangular pellet-supporting unit 34 of FIG. 6 has a flat cross section 34E'. The width W of the cross section 34E' is preferred to be smaller than the length L of each side of a square pellet P, because the pellet row has to be easily transposed to the tape B. In the case of FIG. 6, an angle defined by the inclined plane 34C with the incline plane 34D is chosen to be the same as in FIG. 5.

The apical plane of the second triangular pellet-supporting unit 47 is preferred to have a flat cross section having substantially the same length as one side of a square pellet. In this case, too, two inclined planes of said second triangular pellet-supporting unit 47 are chosen to define an angle having the same magnitude as in the aforementioned case. Obviously, the apical planes of the first and second triangular pellet-supporting units 34, 47 have a length equal to or larger than the row and column of the pellet matrix, respectively.

In the foregoing embodiment, the tape A was made to travel only in the direction AD1. However, it is possible to allow the tape A to run also in the opposite direction AD2 (FIG. 3), set two semiconductor pellets emitting different, for example, red and green lights close to each other, and arrange picture elements emitting a light having a mixed color (yellow) on the tape C in a state spaced from each other at a prescribed distance.

In other words, a matrix of red light-emitting diode pellets and a matrix of green light-emitting diode pellets are mounted on the tape A in advance. The tape A is stretched between the sprocket wheels 36, 37, causing the above-mentioned matrices to be respectively positioned on both sides of the triangular pellet-supporting unit 34. When one row of one matrix of, for example, red light-emitting pellets is transposed to the tape B by the aforementioned operation, the support stage 46 is retracted to slightly shift the triangular pellet-supporting unit 34. Thereafter, the step motor 39 is driven in the reverse direction to cause the tape A to travel in the direction AD2, thereby setting one row of the other matrix of green light-emitting pellets on the apical plane of the triangular pellet-supporting unit 34. The row of green light-emitting pellets is transposed in the proximity of the row of red light-emitting pellets on the tape B. Thereafter, a second row of red light-emitting pellets are transposed to the tape B in a state spaced from the first row of green light-emitting pellets at a prescribed distance. Further, a second row of green light-emitting pellets is transposed to the tape B in the proximity of the second row of red light-emitting pellets. Thereafter the same operation is repeated. When the matrix on the tape B is transposed to the tape C by the same process as described above, then a plurality of picture elements each consisting of one red light-emitting diode pellet and one green light-emitting diode pellet are arranged on the tape C in a state spaced from each other at a prescribed distance. When the semiconductor pellets regularly arranged on the tape C are simultaneously fixed on a wiring substrate, then a display device can be efficiently manufactured.

This invention was described with reference to the aforementioned embodiments. However, the invention is not limited to said embodiments. For instance, the tape B may be formed of an endless tape. The sliding of the support block 27 and the vertical movement of the press board 31 can be electrically controlled by proper drive means. It is also possible to automatically control the operation of the whole semiconductor pellet-arranging apparatus by means of a computer. Further, after the semiconductor pellets on the tape A are transposed to the tape B as described above, the tape B may be removed from the sprocket wheels 16 and 17, and the tape A from the sprocket wheels 36 and 37. Then, the tape B now bearing the semiconductor pellets is set over the pellet-supporting unit 34 between the sprocket wheels 36 and 37 with the adhesive plane thereof kept upward. A new adhesive tape is set between the sprocket wheels 16 and 17 with its adhesive plane thereof kept downward. Thereafter, the similar operations to those described above with respect to the tape A and the tape B is applied to the tape B bearing the pellets and the new tape. As a result, a pellet matrix as shown in FIG. 4 is formed on the new tape.

What we claim is:

1. A semiconductor pellet-arranging apparatus which comprises:

first pellet-supporting means provided with an apical plane and a first inclined plane contiguous to said apical plane;

first drive means for stepwise carrying a first adhesive tape on which there is mounted at least one pellet matrix including a plurality of rows of pellets and a plurality of columns of pellets wherein the pellets constituting each column contact each other along the first inclined plane with the pellet matrixbearing plane of said first tape kept upward in such a manner that the pellet rows of the matrix are successively set on the apical plane of the first pellet-supporting means;

second drive means for carrying a second adhesive tape to a position above the apical plane of the first pellet-supporting means in a direction intersecting the pellet columns at right angles with the adhesive plane of said second adhesive tape made to face the first adhesive tape;

pressing means which, when one row of the pellet matrix mounted on the first adhesive tape is brought to set on the apical plane of the first pellet-supporting means, presses the second adhesive tape against that row of the pellet matrix which is set on the apical plane of the first pellet-supporting means thereby to transpose said pellet row to the apical plane mounted on the second adhesive tape; and third drive means, which, when each pellet row is transposed to the second adhesive tape, shifts the first pellet-supporting means in a direction intersecting the pellet rows at right angles for a prescribed distance.

2. The semiconductor pellet-arranging apparatus according to claim 1, wherein the first pellet-supporting means comprises a second inclined plane which is inclined in the opposite direction to the first inclined plane and is rendered contiguous to the apical plane of said first pellet-supporting means; and the first drive means carries the first adhesive tape downward from the apical plane of said first pellet-supporting means along said second inclined plane.

3. The semiconductor pellet-arranging apparatus according to claim 2, wherein the first pellet-supporting means comprises of a block having a triangular cross section.

4. The semiconductor pellet-arranging apparatus according to claim 3, wherein the apical plane of the first pellet-supporting means has a length not less than one pellet row and a shorter width than one side of the pellet.

5. The semiconductor pellet-arranging apparatus according to claim 4, wherein the first inclined plane of the first pellet-supporting means defines an angle of 10° to 120° with the second incline plane thereof.

6. The semiconductor pellet-arranging apparatus according to claim 5, wherein the first drive means includes a first pair of sprocket wheels disposed on both sides of the first pellet-supporting means.

7. The semiconductor pellet-arranging apparatus according to claim 6, wherein the first drive means includes a stepping motor connected to one of said first paired sprocket wheels and a torque motor connected to the other of said first paired sprocket wheels.

8. The semiconductor pellet-arranging apparatus according to claim 5, wherein the second drive means includes a second pair of sprocket wheels positioned above the first triangular pellet-supporting means in a state separated from each other.

9. The semiconductor pellet-arranging apparatus according to claim 8, wherein the second drive means includes a stepping motor connected to one of said second pair of sprocket wheels and a torque motor connected to the other of said second pair of sprocket wheels.

10. The semiconductor pellet-arranging apparatus according to any of claims 1 to 9, which further comprises:
    second pellet-supporting means provided with an apical plane and a first inclined plane contiguous thereto and positioned apart from the first pellet-supporting means as viewed from the traveling direction of the second adhesive tape;
    fourth drive means for carrying a third adhesive tape along the first inclined plane of the second pellet-supporting means over its apical plane in a direction parallel with the pellet column; and
    pressing means which, each time the column of the pellet matrix transposed to the second adhesive tape is brought above the apical plane of the second pellet-supporting means, presses the second adhesive tape in such a manner that the pellet columns on the second adhesive tape are brought into contact with the third adhesive tape on the apical plane of the second pellet-supporting means, thereby transposing said pellet column to the third tape.

11. The semiconductor pellet-arranging apparatus according to claim 10, wherein the second pellet-supporting means comprises a second inclined plane which is inclined in the opposite direction of the first inclined plane and is rendered contiguous to the apical plane of said second pellet-supporting means; and the fourth drive means carries a third adhesive tape downward from the apical plane of the second pellet-supporting means along the second inclined plane.

12. The semiconductor pellet-arranging apparatus according to claim 11, wherein the second pellet-supporting means comprises a block having a triangular cross section.

13. The semiconductor pellet-arranging apparatus according to claim 12, wherein the apical plane of the second triangular pellet-supporting means has a length not less than one pellet column mounted on the second adhesive tape, and substantially the same width as one side of the pellet.

14. The semiconductor pellet-arranging apparatus according to claim 13, wherein the first inclined plane of the second pellet-supporting means defines an angle of 10° to 120° with the second inclined plane thereof.

15. The semiconductor pellet-arranging apparatus according to claim 14, wherein the fourth drive means comprises a third pair of sprocket wheels disposed on both sides of the second pellet-supporting means.

16. The semiconductor pellet-arranging apparatus according to claim 15, wherein the fourth drive means includes a stepping motor connected to one of the third pair of sprocket wheels and a torque motor connected to the other of said third pair of sprocket wheels.

17. The semiconductor pellet-arranging apparatus according to claim 16, wherein the first and second pressing means are formed of a press board reciprocatively set between the first and second pellet-supporting means.

* * * * *